(12) United States Patent
Lee et al.

(10) Patent No.: US 9,871,096 B2
(45) Date of Patent: Jan. 16, 2018

(54) SERIAL CAPACITOR DEVICE WITH MIDDLE ELECTRODE CONTACT

(71) Applicant: GLOBALFOUNDRIES Inc., Grand Cayman (KY)

(72) Inventors: Ki Young Lee, Schenectady, NY (US); Woong Lae Cho, Mechanicville, NY (US); Jae Ho Joung, Cohoes, NY (US)

(73) Assignee: GLOBALFOUNDRIES Inc., Grand Cayman (KY)

(*) Notice: Subject to any disclaimer, the term of this patent is extended or adjusted under 35 U.S.C. 154(b) by 0 days.

(21) Appl. No.: 15/459,450

(22) Filed: Mar. 15, 2017

(65) Prior Publication Data

US 2017/0250243 A1    Aug. 31, 2017

Related U.S. Application Data

(62) Division of application No. 15/052,961, filed on Feb. 25, 2016, now Pat. No. 9,640,608.

(51) Int. Cl.
| | |
|---|---|
| *H01L 23/00* | (2006.01) |
| *H01L 21/768* | (2006.01) |
| *H01L 49/02* | (2006.01) |
| *H01L 27/108* | (2006.01) |

(52) U.S. Cl.
CPC ........ *H01L 28/60* (2013.01); *H01L 27/10805* (2013.01)

(58) Field of Classification Search
CPC ......... H01L 2924/0002; H01L 2924/00; H01L 28/60; H01L 23/5223; H01L 23/53238
USPC .......... 257/E21.008, E21.579, 532; 438/253, 438/396, 381, 393, 239, 240, 250
See application file for complete search history.

(56) References Cited

U.S. PATENT DOCUMENTS

| | | | |
|---|---|---|---|
| 5,576,240 A | 11/1996 | Radosevich et al. | |
| 6,166,423 A | 12/2000 | Gambino et al. | |
| 6,461,914 B1 | 10/2002 | Roberts et al. | |
| 7,332,764 B2 * | 2/2008 | Choi | H01L 21/76841 257/296 |
| 8,623,735 B2 | 1/2014 | Lee et al. | |
| 8,809,149 B2 | 8/2014 | Lee et al. | |
| 2010/0279484 A1 * | 11/2010 | Wang | H01L 28/75 438/396 |
| 2012/0080771 A1 * | 4/2012 | Yang | H01L 23/5223 257/532 |
| 2013/0065375 A1 | 3/2013 | Lee et al. | |
| 2014/0098459 A1 * | 4/2014 | Lee | H01L 27/10805 361/306.1 |
| 2014/0159199 A1 * | 6/2014 | Lee | H01L 29/66181 257/532 |

\* cited by examiner

*Primary Examiner* — Jonathan Han
(74) *Attorney, Agent, or Firm* — Amerson Law Firm, PLLC (57) ABSTRACT

A capacitor includes a bottom electrode and a top electrode positioned above the bottom electrode. The top electrode and the bottom electrode are conductively coupled to one another. A middle electrode is positioned between the bottom electrode and the top electrode. A lower dielectric layer is positioned between the bottom electrode and the middle electrode. An upper dielectric layer is positioned between the middle electrode and the top electrode. A first contact is conductively coupled to the top electrode. A second contact is conductively coupled to the middle electrode.

17 Claims, 8 Drawing Sheets

SERIAL CAPACITOR DEVICE WITH MIDDLE ELECTRODE CONTACT

BACKGROUND OF THE INVENTION

1. Field of the Invention

Generally, the present disclosure relates to the manufacture of sophisticated semiconductor devices, and, more specifically, to a serial capacitor device with a middle electrode contact and methods of making such a capacitor device.

2. Description of the Related Art

In addition to the large number of transistor elements, a plurality of passive circuit elements, such as capacitors, are typically formed in integrated circuits that are used for a plurality of purposes, such as charge storage for storing information, for decoupling and the like. Decoupling in integrated circuits is an important aspect for reducing the switching noise of the fast switching transistors, since the decoupling capacitor may provide energy at a specific point of the circuitry, for instance at the vicinity of a fast switching transistor, and thus reduce voltage variations caused by the high transient currents which may otherwise unduly affect the logic state represented by the transistor.

Due to the decreased dimensions of circuit elements, not only the performance of the individual transistor elements may be increased, but also their packing density may be improved, thereby providing the potential for incorporating increased functionality into a given chip area. For this reason, highly complex circuits have been developed, which may include different types of circuits, such as analog circuits, digital circuits and the like, thereby providing entire systems on a single chip (SoC). Furthermore, in sophisticated micro-controller devices and other sophisticated devices, an increasing amount of storage capacity may be provided on chip with the CPU core, thereby also significantly enhancing the overall performance of modern computer devices. For example, in typical micro-controller designs, different types of storage devices may be incorporated so as to provide an acceptable compromise between die area consumption and information storage density versus operating speed. For example, static RAM memories may be formed on the basis of registers, thereby enabling an access time determined by the switching speed of the corresponding transistors in the registers. Typically, a plurality of transistors may be required to implement a corresponding static RAM cell, thereby significantly reducing the information storage density compared to, for instance, dynamic RAM (DRAM) memories including a storage capacitor in combination with a pass transistor. Thus, a higher information storage density may be achieved with DRAMs, although at a reduced access time compared to static RAMs, which may nevertheless render dynamic RAMs attractive in complex semiconductor devices.

Complex integrated circuit devices typically include a memory array, such as an embedded DRAM array, and other non-memory circuits, e.g., logic circuits (such as microprocessors), located outside of the memory array. One problem associated with manufacturing such complex devices is that some designers and manufacturing engineers tend to treat the regions outside the memory array and the memory array itself as completely separate items, each with their own unique design rules and process flows. As a result, in some cases, manufacturing such complex devices is not as cost-effective or efficient as it could be. For example, by independently focusing on one region to the exclusion of the other, additional manufacturing operations may be performed only in that one region, which tends to require additional manufacturing time, makes the resulting device more costly, and may lead to decreased product yields.

In recent years, as the integration density of semiconductor devices increases, the area occupied by individual devices continues to decrease. Specifically, a capacitor for storing data of a dynamic random access memory (DRAM) is required to have sufficient capacitance irrespective of the decrease in the area occupied by the capacitor. Accordingly, metal-insulator-metal (MIM) capacitors, in which a lower electrode and an upper electrode are formed of metal and separated by a layer of insulating material, have been used in many integrated circuit products. Additionally, MIM capacitors have been used extensively in semiconductor devices that perform analog-to-digital conversions and digital-to-analog conversions. Conversion between analog signals and digital signals requires that capacitors employed in such conversion processes be stable, i.e., the capacitance of the capacitor must be relatively stable over a range of applied voltages and temperatures. The capacitance of capacitors with polysilicon electrodes tends to be relatively unstable as the capacitance of such capacitor structures tends to vary with changes in temperature and applied voltage. Accordingly, capacitors with polysilicon electrodes are typically not used for such conversion applications.

In forming the upper and lower metal electrodes of a typical MIM capacitor, an etching process is typically performed to pattern a metal layer. However, as the integration density of semiconductor devices has increased over the recent years, it has become more difficult to etch such metal layers. In particular, copper, which has good electromigration resistance and a desirable low resistivity, is very difficult to etch. Accordingly, various methods for forming the upper and lower metal electrodes through a damascene process, a process which does not involve etching a metal layer, has been proposed. See, for example, U.S. Pat. No. 6,649,464. A copper damascene process generally comprises forming a trench for a copper structure in an insulation layer, forming a sufficient amount of copper to overfill the trench, and removing the excess copper from the substrate, thereby leaving the copper structure in the trench. However, the damascene process used in forming copper-based capacitors and conductive lines and vias is a very time-consuming, expensive, multiple step process where chances for creating undesirable defects always exists.

As noted above, it is not uncommon for a typical integrated circuit product to contain separate regions or areas where logic circuits and circuits requiring capacitors (memory circuits) are formed. As device dimensions have continued to shrink, the area or plot space allotted for forming conductive contact structures and metal lines and vias has continued to decrease as well. In some cases, in so-called "back-end-of-line" processing, metal hard mask layers are employed as etch masks instead of traditional photoresist masks so as to increase etch selectivity between the etch mask and the dielectric material and to enable the more accurate formation of openings for conductive structures, like conductive vias formed using a damascene process.

The present disclosure is directed to a high density serial capacitor device and methods of making such a capacitor device.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a capacitor device and methods of making such a capacitor device. In one illustrative embodiment, the capacitor includes, among other things, a bottom electrode and a top electrode positioned above the bottom electrode. The top electrode and the bottom electrode are conductively coupled to one another. A middle electrode is positioned between the bottom electrode and the top electrode. A lower dielectric layer is positioned between the bottom electrode and the middle electrode. An upper dielectric layer is positioned between the middle electrode and the top electrode. A first contact is conductively coupled to the top electrode. A second contact is conductively coupled to the middle electrode.

Another illustrative capacitor that is disclosed herein includes, among other things, a bottom electrode and a top electrode positioned above the bottom electrode. The top electrode and the bottom electrode are conductively coupled to one another. A middle electrode is positioned between the bottom electrode and the top electrode. The middle electrode includes an extension portion that is coplanar with the top electrode. A lower dielectric layer is positioned between the bottom electrode and the middle electrode. An upper dielectric layer is positioned between the middle electrode and the top electrode. An isolation region of dielectric material is formed above a portion of the extension region and laterally disposed between the extension region and the top electrode. A first contact is conductively coupled to the top electrode. A second contact is conductively coupled to the middle electrode.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 1A:
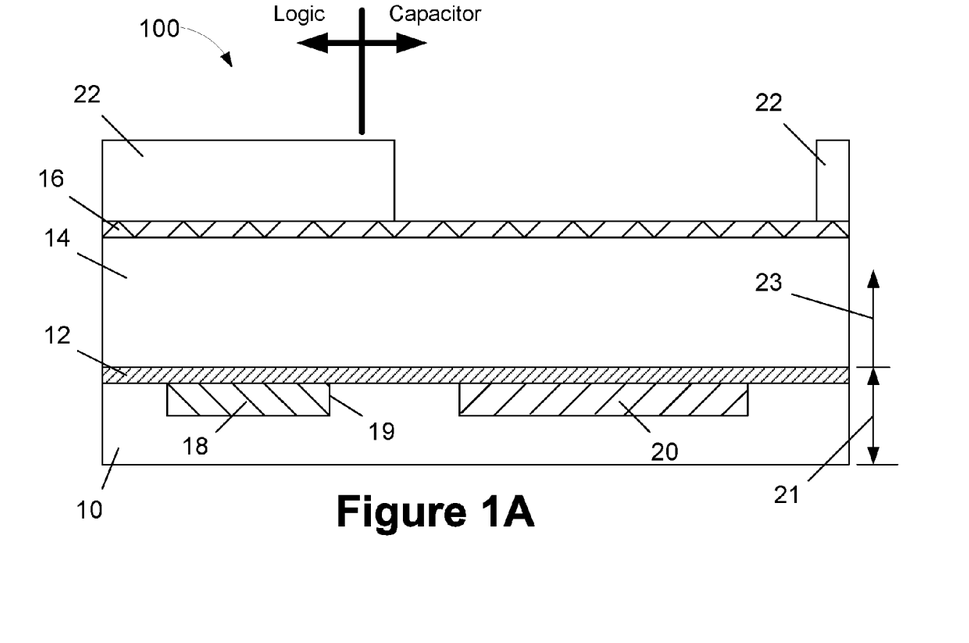
FIGS. 1A-1P depict various illustrative methods of forming an illustrative embodiment of a high density serial capacitor device described herein.

The present disclosure is directed to a serial capacitor device with a middle electrode contact and methods of making such a capacitor device. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc. With reference to FIGS. 1A-1P, various illustrative embodiments of the certain methods and certain devices disclosed herein will now be described in more detail.

FIG. 1A is a simplified view of a portion of an illustrative semiconductor device or product 100 at an early stage of manufacturing. The device 100 was formed above a semiconducting substrate (not shown). At the point of fabrication depicted in FIG. 1A, the device 100 includes an illustrative first insulating layer 10, a non-conductive diffusion barrier layer 12 second insulating layer 14, a hard mask layer 16, a patterned mask layer 22, a conductive structure 18, e.g., a conductive line, and a bottom electrode 20 of what will become a serial capacitor. The conductive structures 18, 20 are physically spaced apart in the first insulating layer 10. The layers 10, 12 and the conductive structures 18, 20 are part of a first metallization layer 21, while the other materials shown in FIG. 1A will become part of a second metallization layer 23. The layer 12 is the uppermost barrier layer of the first metallization layer 21. The metallization layers 21, 23 are intended to be representative in nature as they may be at any level of the device 100. For example, the metallization layer 21 may be the so-called "contact" or "CA" layer or it may be the so-called "metal-1" or "M1" that constitutes the first level of the general wiring circuits for the device 100. As a specific example, the metallization layer 21 may be the CA layer, while the metallization layer 23 may be the M1 layer. As another example, the metallization layer 21 may be the third general metallization layer of the device 100, while the metallization layer 23 may be the fourth general metallization layer of the device 100. Of course, the device may have any desired number of metallization layers. Thus, when reference is made herein to any metallization layer, it should be understood that such layer may be at any level in an integrated circuit product, and that the novel devices disclosed herein may be formed at any level of an integrated circuit product.

The various layers depicted in FIG. 1A may be formed from a variety of different materials, and they may be formed by performing a variety of techniques, such as a chemical vapor deposition (CVD), atomic layer deposition (ALD), physical vapor deposition (PVD) or plasma enhanced versions of such processes. The thickness of such layers may also vary depending upon the particular application. For example, in one illustrative embodiment, the first insulating layer 10 may be comprised of a material such as silicon dioxide, silicon oxynitride, low-k silicon dioxide, a low-k material (k value less than 2.7), etc. In one specific example, the first insulating layer 10 may be a layer of silicon dioxide having a thickness of about 400-600 nm that is initially formed by performing a CVD process. As another example, in one illustrative embodiment, the non-conductive diffusion barrier layer 12 may be comprised of a material, such as silicon nitride, NBLoK™, silicon carbon nitride, a nitrogen-doped silicon carbide, etc., that will help prevent or at least reduce any undesirable migration of the conductive materials in the conductive structure 18 and/or the bottom electrode 20. In one specific example, the non-conductive diffusion barrier layer 12 may be a layer of NBLoK™ having a thickness of about 20-40 nm that is initially formed by performing a CVD process.

Continuing with the discussion of FIG. 1A, in one illustrative embodiment, the second insulating layer 14 may be comprised of a material such as a so-called low-k insulating material (k value less than 2.7), an ultra-low-k insulating material (k value of less than 2.3), silicon dioxide, OMCTS (Octamethyleyelotetrasiloxane) oxide film, etc. In one specific example, the second insulating layer 14 may be a layer of a low-k insulating material having a thickness of about 700-1000 nm that is initially formed by performing a CVD process. In one illustrative embodiment, the hard mask layer 16 may be comprised of a variety of materials such as, for example, a TEOS-based silicon dioxide, silicon nitride, etc. In one specific example, the hard mask layer 16 may be a layer of TEOS-based silicon dioxide having a thickness of about 30-40 nm that is initially formed by performing a CVD process. Among other things, the hard mask layer 16 acts to protect the underlying second layer of insulating material 14. The patterned mask layer 22 may be comprised of a variety of materials (e.g., a photoresist material, an organic patterning layer, an anti-reflective coating (ARC) layer, or a combination thereof) and it may be formed using known photolithography techniques.

Still referring to FIG. 1A, the schematically depicted conductive structure 18 may be comprised of a variety of conductive materials, such as copper, copper manganese, silver, etc., and it may be formed using a variety of known techniques. In one specific example, the conductive structure 18 is a copper line that is formed using known damascene techniques. The conductive structure 18 may be part of the overall metallization system for the device 100. Of course, the size, shape and configuration of the conductive structure 18 may vary depending upon the particular application. In one specific example, the conductive structure 18 may have a thickness that ranges from about 40-60 nm. So as not to obscure the present inventions, various details and layers associated with the formation of the conductive structure 18 are not depicted in the drawings. For example, one or more barrier layers (not shown) are typically formed in the trench 19 prior to depositing the conductive material, e.g., copper in the trench 19. Similarly, the bottom electrode 20 may be comprised of a variety of conductive materials, such as copper, copper manganese, silver, etc., and it may be formed using a variety of techniques. The thickness of the bottom electrode 20 may also vary depending upon the particular application. In one illustrative embodiment, the bottom electrode 20 may be comprised of copper, it may be formed using known damascene techniques, and it may have a thickness of about 40-60 nm. The lateral width of the bottom electrode 20 may also vary depending upon the particular application. Any barrier layers that may be formed as part of the process of forming the bottom electrode 20 are not depicted in FIG. 1A so as not to obscure the present subject matter.

Figure 1B:
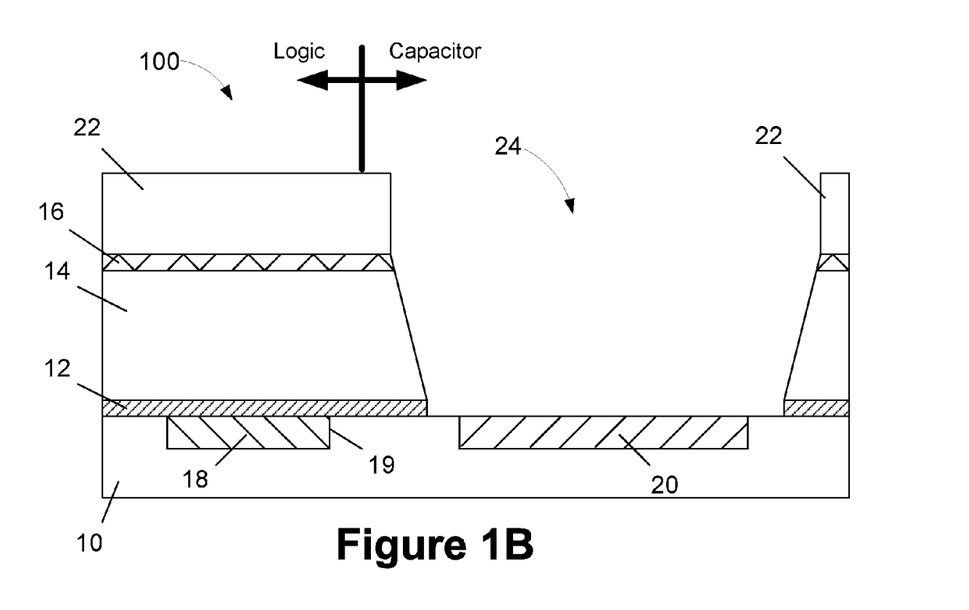

FIG. 1B illustrates the product 100 after one or more etching processes were performed through the patterned mask layer 22 to define a recess 24. Either dry or wet etching processes may be employed in forming the recess 24. In one illustrative embodiment, the recess 24 was formed by performing dry anisotropic etching processes to define the recess 24, with appropriate changes in the etch chemistry of such etching processes as may be required to etch through the hard mask layer 16, the second layer of insulating material 14, and, optionally, the barrier layer 12. In some embodiments, the barrier layer 12 may not be removed from the bottom portion of the recess 24. The size and configuration of the recess 24 may vary depending upon the particular application.

Figure 1C:
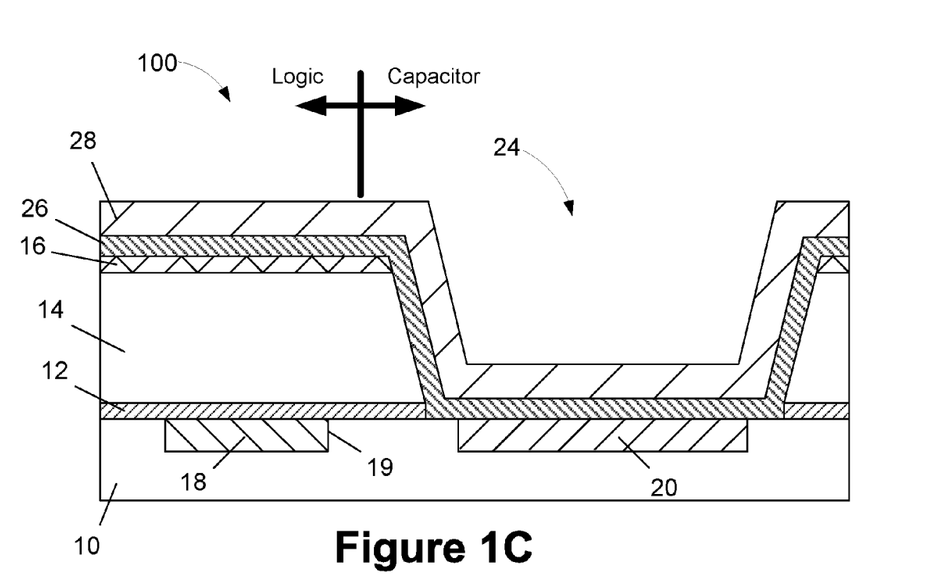

FIG. 1C illustrates the product 100 after one or more deposition processes were performed to form a second hard mask layer 26 and a conductive middle electrode layer 28. In one illustrative embodiment, the second hard mask layer 26 may be comprised of a variety of materials such as, for example, a TEOS-based silicon dioxide, silicon nitride, etc. In one specific example, the second hard mask layer 26 may be a layer of TEOS-based silicon dioxide having a thickness of about 30-40 nm that is initially formed by performing a CVD process. In one illustrative embodiment, the conductive middle electrode layer 28 may be comprises of a conductive material such as TiN, Ti, TaN, Ta, a combination thereof, or the like. In general, the material of the middle electrode layer 28 is selected to provide etch selectivity for etching the hard mask layers 16, 26, and the insulating material 14.

Figure 1D:
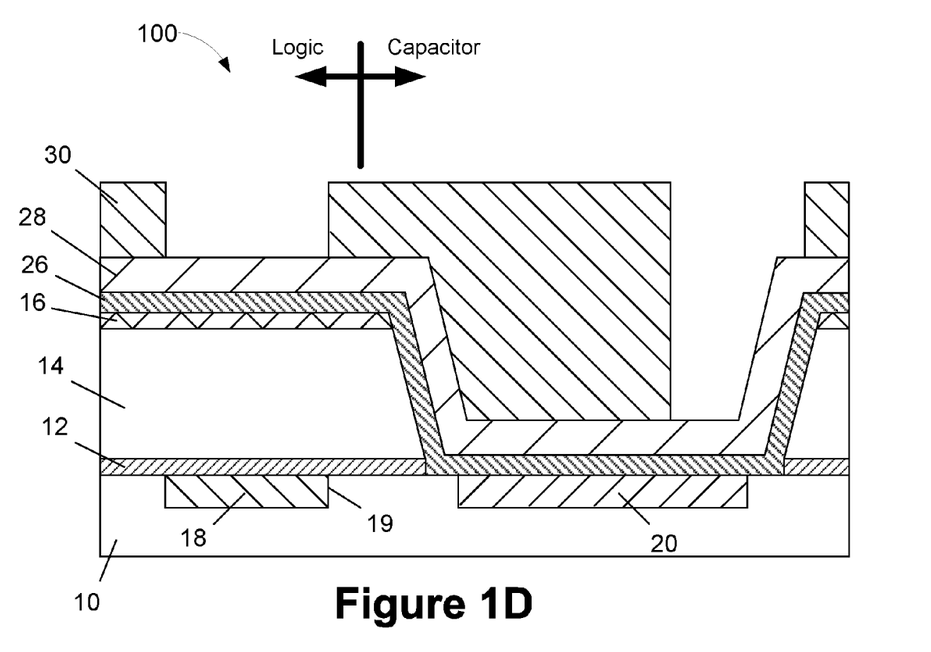

FIG. 1D illustrates the product 100 after a patterned mask layer 30 was formed above the middle electrode layer 28.

Figure 1E:
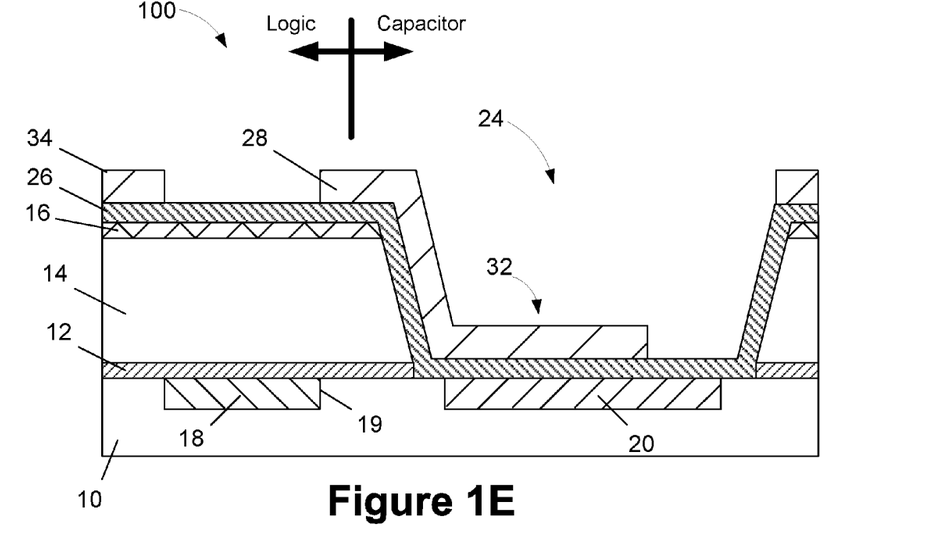

FIG. 1E illustrates the product after one or more etch processes were performed through the patterned mask layer 30 to etch the middle electrode layer 28 to define a middle electrode 32 and a mask portion 34 and to remove the patterned mask layer 30.

Figure 1F:
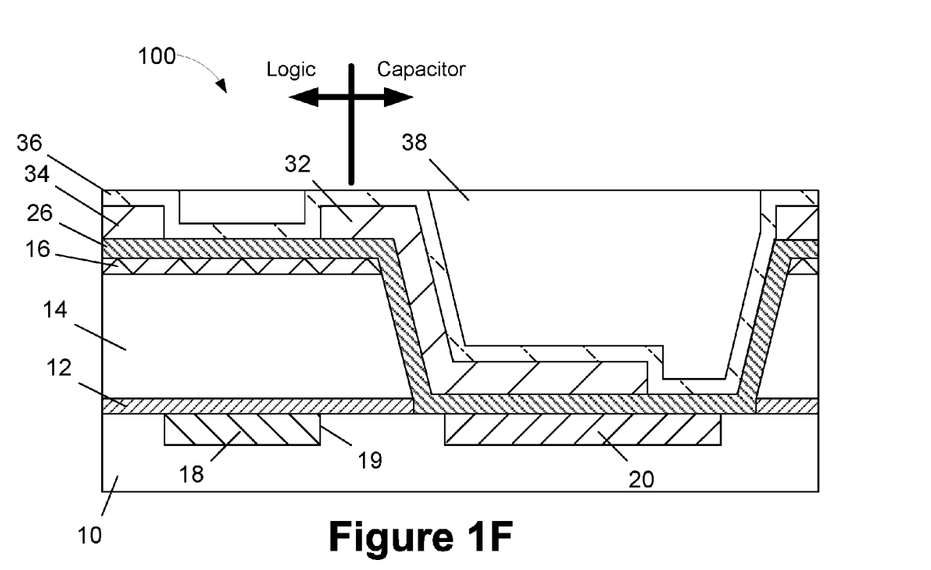

FIG. 1F illustrates the product 100 after a plurality of processes was performed. A first deposition process was performed to form a dielectric layer 36 above the middle electrode layer 28 and the mask portion 34. A second deposition was performed to form a third insulating layer 38. A planarization process was performed to remove portions of the third insulating layer 38 extending beyond the recess 24. The dielectric layer 36 may be comprised of a variety of materials such as, for example, a TEOS-based silicon dioxide, silicon nitride, etc. In one specific example, the dielectric layer 36 may be a layer of TEOS-based silicon dioxide having a thickness of about 30-40 nm that is initially formed by performing a CVD process. The third insulating layer 38 may be comprised of a material such as a so-called low-k insulating material (k value less than 2.7), an ultra-low-k insulating material (k value of less than 2.3), silicon dioxide, OMCTS (Octamethyleyelotetrasiloxane) oxide film, etc. In some embodiments, an optional etch process may be performed to recess the third insulating layer 38 to remove the portion disposed above the dielectric layer 36 in the logic region.

Figure 1G:
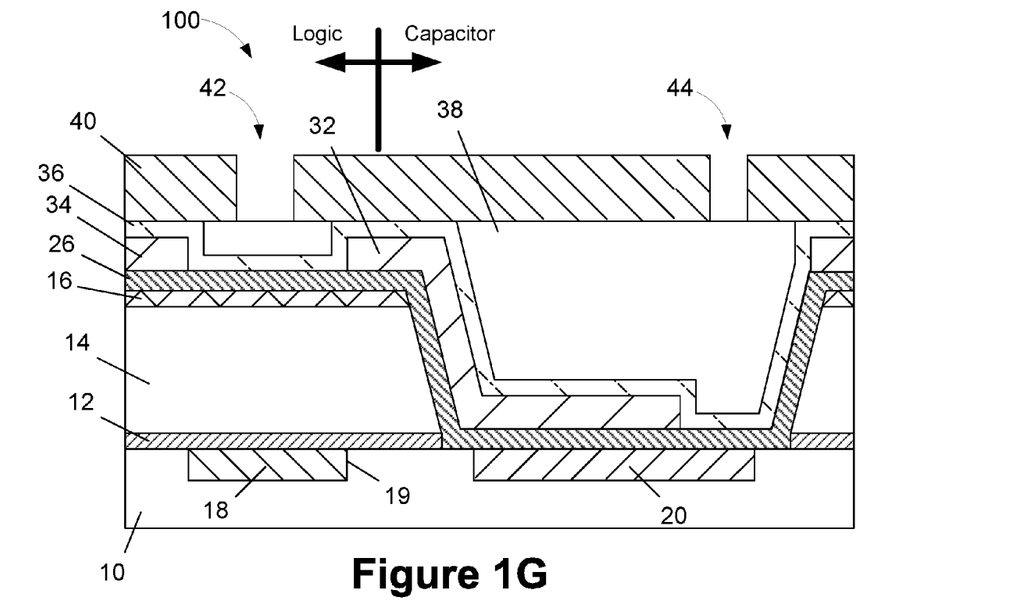

FIG. 1G illustrates the product 100 after a patterned mask layer 40 was formed above the third insulating layer 38. The patterned mask layer 40 defines a hole opening 42 (i.e., having a generally circular cross section) and a bar opening 44 (i.e., extending into the page and having a rectangular cross section). In some embodiments, different combinations of hole openings and bar openings may be employed.

Figure 1H:
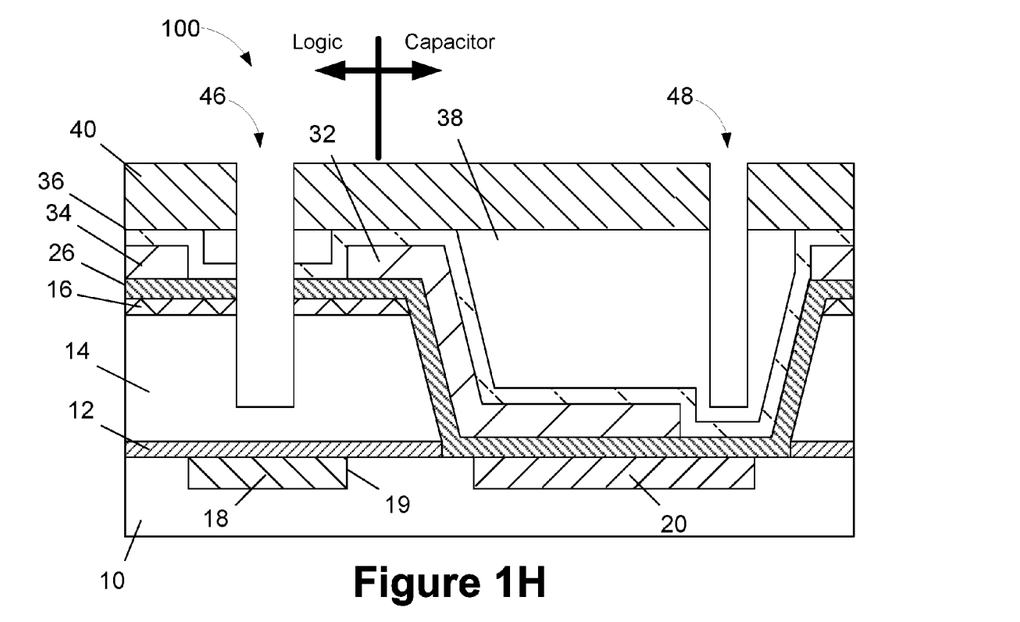

FIG. 1H illustrates the product 100 after an anisotropic etch was performed through the patterned mask layer 40 to define via openings 46, 48. A timed etch process may be employed and terminated at a point corresponding to about 90% of the thickness of the third insulating layer 38.

Figure 1I:
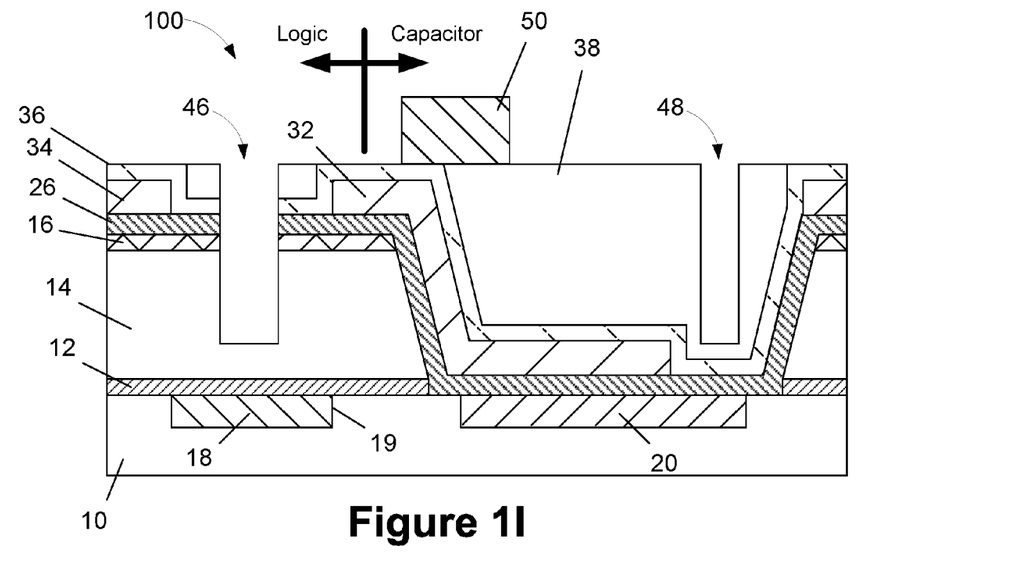

FIG. 1I illustrates the product 100 after an etch process was performed to remove the patterned mask layer 40 and a plurality of processes was performed to form a patterned mask layer 50 (e.g., photoresist) above an edge portion of the middle electrode 32.

Figure 1J:
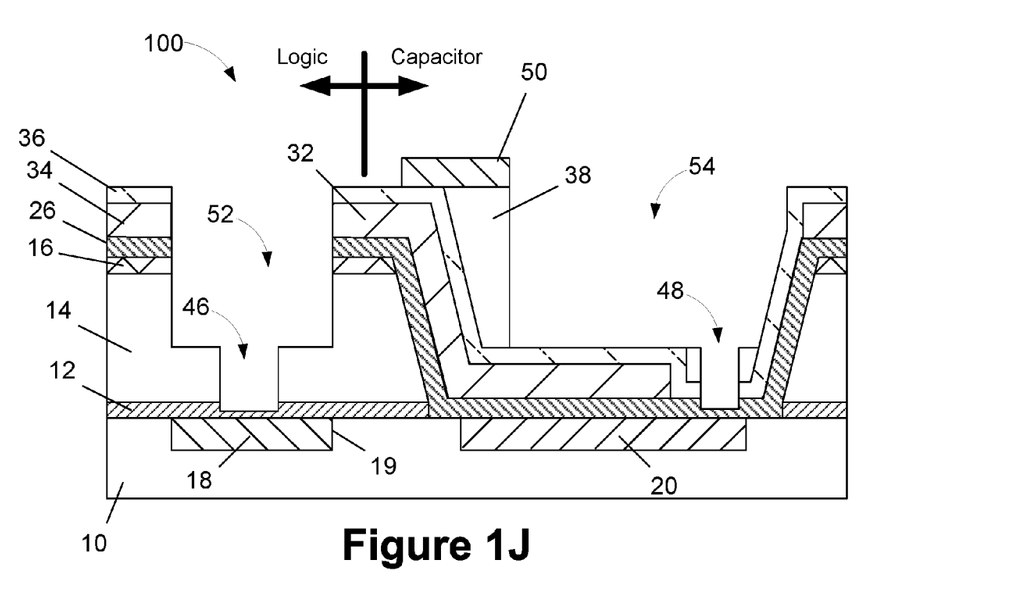

FIG. 1J illustrates the product 100 an etch process was performed to define a trench opening 52 in the second insulating layer 14 and a trench opening 54 in the third insulating layer 38. In some embodiments the etch process may include a timed etch to remove most of the material of the third insulating layer 38 followed by a selective wet etch to clear the remaining portions in the trench 54. The selective wet etch may result in some undercutting of the patterned mask layer 50. A portion of the patterned mask layer 50 may be consumed during the etch process. The trench etch is self-aligned in the logic region due to the presence of the middle electrode 32 and the mask portion 34.

Figure 1K:
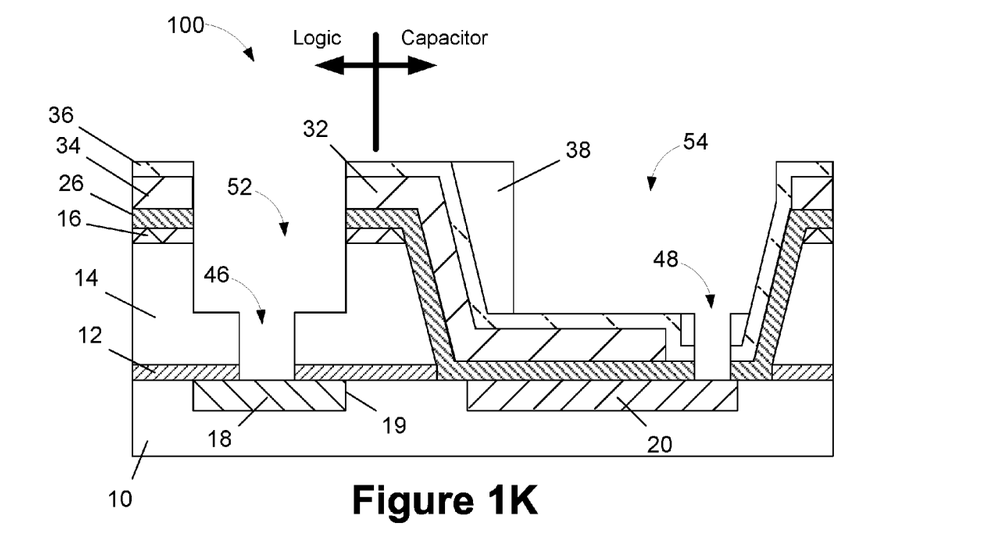

FIG. 1K illustrates the product after a strip process was performed to remove the patterned mask layer 50 and an etch process was performed to etch the barrier layer 12 to expose the conductive structure 18 and the bottom electrode 20.

Figure 1L:
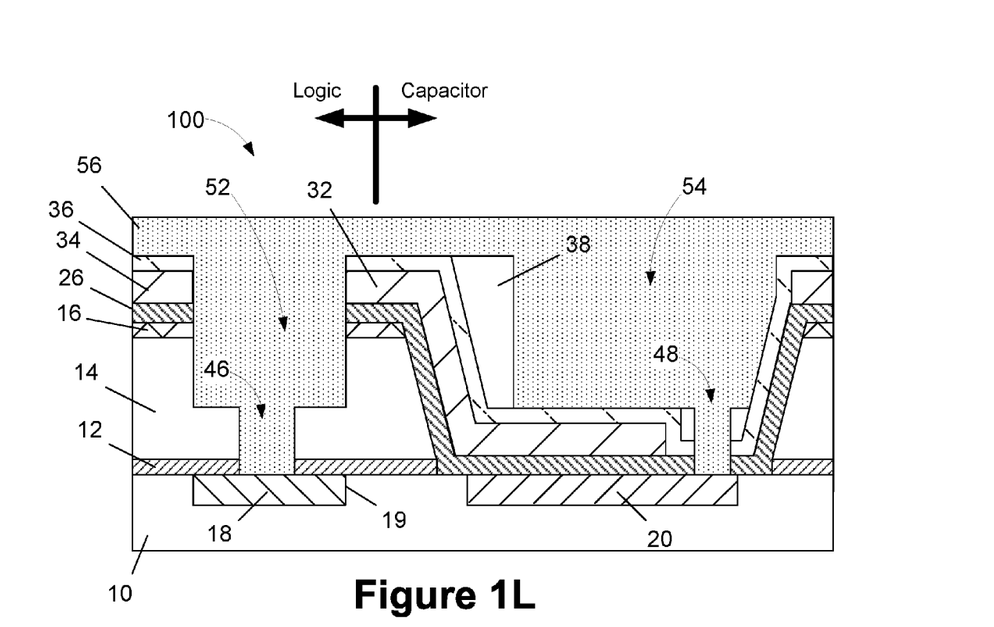

FIG. 1L illustrates the product 100 after one or more deposition process were performed to fill the via openings 46, 48 and the trench openings 52, 54 with a conductive material 56. The conductive material 56 may include a plurality of layers (not separately shown), such as a barrier layer (e.g., Ta, TaN, Ti, TiN), a seed layer (e.g., copper), and a conductive fill layer (e.g., copper).

Figure 1M:
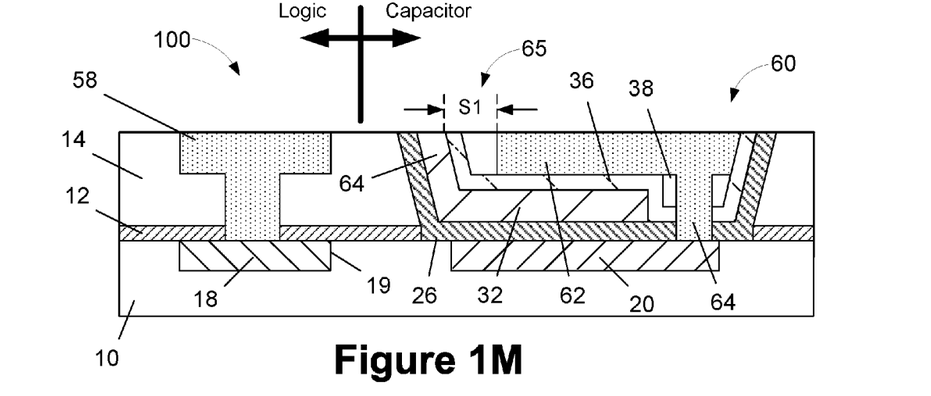

FIG. 1M illustrates the device after a planarization process was performed to remove portions of the layers extending above a surface of the second insulating layer 14 to define a logic interconnect 58 including a via 58V connecting to the conductive structure 18 in the logic region and a MIM series capacitor 60 in the capacitor region. The MIM series capacitor 60 is defined by the bottom electrode 20, the middle electrode 32, and a top electrode 62. A via 62V couples the top electrode 62 to the bottom electrode 20. The vias 58V, 62V may be hole type vias or bar type vias. The remaining portions of the second hard mask layer 26 (and portions of the barrier layer 12 if not removed in FIG. 1B) define the bottom dielectric between the bottom electrode 20 and the middle electrode 32. The remaining portions of the dielectric layer 36 define the top dielectric between the middle electrode 32 and the top electrode 62. Since the middle electrode 32 was formed on a sidewall of the recess 24 defined in the second insulating layer 14 (see FIG. 1C) an extension portion 64 of the middle electrode 32 is coplanar with the top electrode 62. An isolation region 65 is formed by the third insulating layer 38 and is defined by the distance 51 between the extension portion 64 and the top electrode 62 is controlled by the width of the patterned mask layer 50 (see FIG. 1I).

Figure 1N:
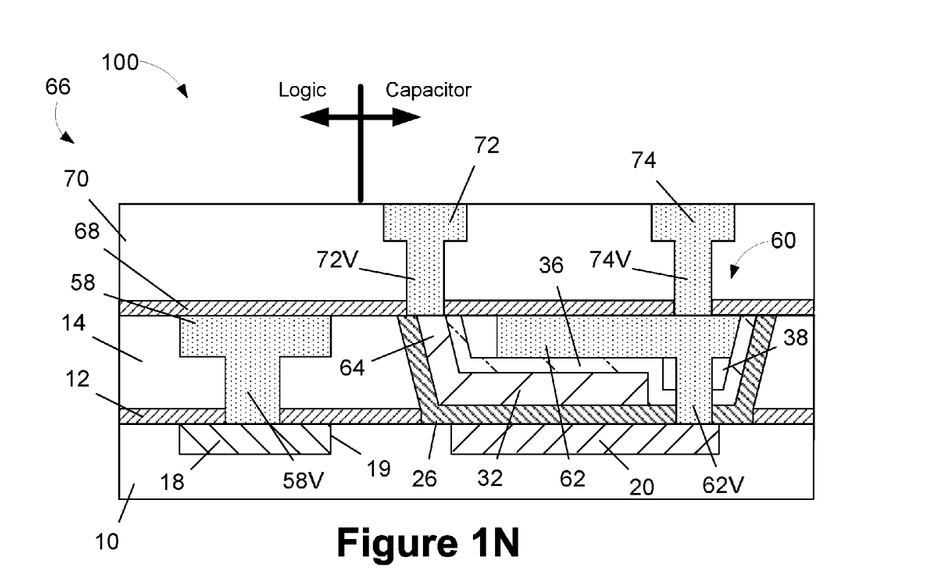

FIG. 1N illustrates the product 100 after a plurality of processes was performed to define a metallization layer 66 (e.g., M2) above the MIM series capacitor 60 and the logic interconnect 58. The metallization layer 66 includes a barrier layer 68, a fourth insulating layer 70, a middle node interconnect 72 contacting the extension portion 64 of the middle electrode 32, and a top/bottom node interconnect 74 contacting the top electrode 62. In one illustrative embodiment, the barrier layer 68 may comprise a material similar to that of the barrier layer 12, the fourth insulating layer 70 may comprise a material similar to that of the second insulating layer 14, and the middle node interconnect 72 and the top/bottom node interconnect 74 may comprise a material similar to that of the top electrode 62.

Figure 1O:
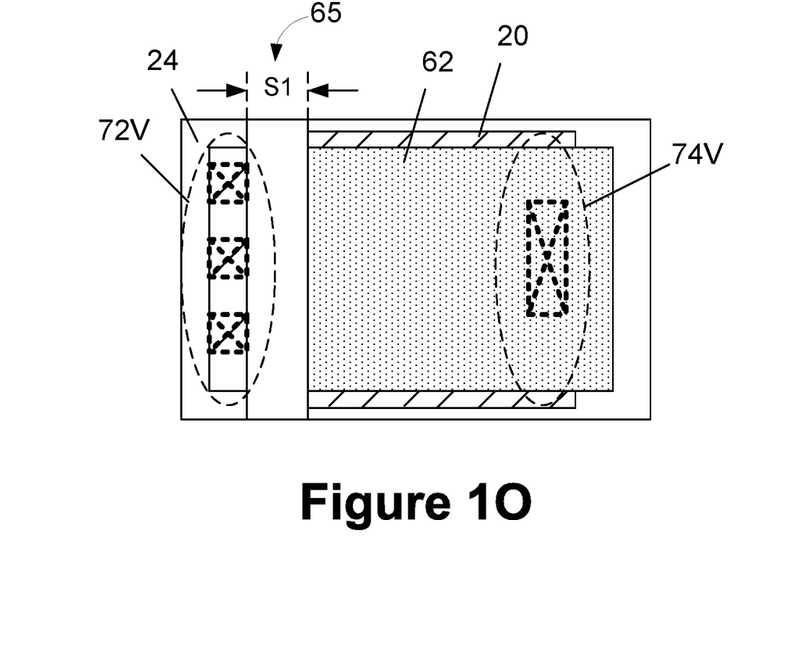
Figure 1P:
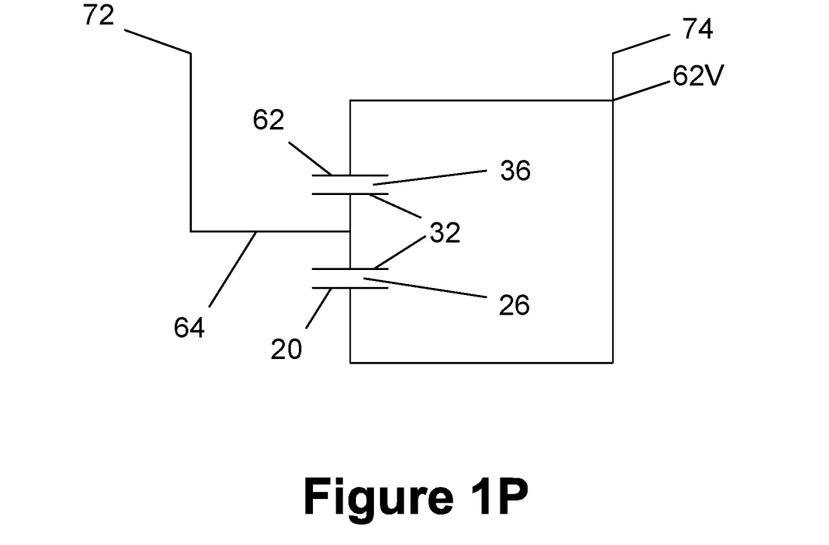

FIG. 1O is a plan view of the MIM series capacitor 60 wherein cross-hatching has been maintained in an effort to facilitate a better understanding of the structure. Various layers have been omitted so that the overlay relationship between the electrodes 20, 32, 62 may be visualized. The isolation region 65 separates the extension portion 64 of the middle electrode 32 from the top electrode 62. A via portion 72V of a middle node interconnect 72 contacts the extension portion 64, and a via portion 74V of a top/bottom node interconnect 74 contacts the top electrode 62 and the bottom electrode 20 through the via 62V (see FIG. 1N). The via portion 72V is illustrated as a plurality of individual or discreet hole contacts (depicted in dashed lines), while the via portion 74V is illustrated as being a bar-type via. Of course, if desired, any of the vias 58V, 62V, 72V, 74V depicted herein may be discreet hole-type features, bar-type features, or some combination thereof.

FIG. 1P illustrates a schematic diagram of the MIM series capacitor 60 defined by the bottom electrode 20, the middle electrode 32, and the top electrode 62. The via 62V couples the top electrode 62 to the bottom electrode 20. The remaining portions of the second hard mask layer 26 (and portions of the barrier layer 12 if not removed in FIG. 1B) define the bottom dielectric between the bottom electrode 20 and the middle electrode 32. The remaining portions of the dielectric layer 36 define the top dielectric between the middle electrode 32 and the top electrode 62.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:
1. A capacitor, comprising:
a bottom electrode;
a top electrode positioned above said bottom electrode, a conductive via connecting said top electrode and said bottom electrode directly to one another, said conductive via having a first end directly contacting a top surface of said bottom electrode and a second end directly contacting a bottom surface of said top electrode;

a middle electrode positioned vertically between said bottom electrode and said top electrode;

a lower dielectric layer positioned between said bottom electrode and said middle electrode;

an upper dielectric layer positioned between said middle electrode and said top electrode;

a first contact conductively coupled to said top electrode; and a second contact conductively coupled to said middle electrode.

2. The capacitor of claim 1, wherein said middle electrode comprises an extension portion that is coplanar with said top electrode.

3. The capacitor of claim 2, wherein said middle electrode is formed in a recess having a sidewall, and said extension portion is positioned at least partially on said sidewall of said recess.

4. The capacitor of claim 3, further comprising an isolation region of dielectric material formed above a first portion of said upper dielectric layer positioned above a horizontal portion of said extension portion and laterally disposed between a second portion of said upper dielectric layer positioned adjacent a vertical portion of said extension portion and said top electrode, said isolation region and said upper dielectric layer providing a first separation between said middle electrode and said top electrode adjacent said vertical portion having a first width greater than a second width of a second separation between said middle electrode and said top electrode adjacent said horizontal portion.

5. The capacitor of claim 4, wherein said recess has a sloped sidewall.

6. The capacitor of claim 1, further comprising a barrier layer positioned between said bottom electrode and said lower dielectric layer.

7. The capacitor of claim 1, further comprising a first dielectric layer formed above said top electrode, wherein said first and second contacts are embedded in said first dielectric layer.

8. The capacitor of claim 1, wherein said middle electrode comprises at least one of TiN, Ti, TaN, or Ta.

9. The capacitor of claim 8, wherein said top electrode comprises copper.

10. A capacitor, comprising:

a bottom electrode;

a top electrode positioned above said bottom electrode, said top electrode and said bottom electrode being conductively coupled to one another;

a middle electrode positioned between said bottom electrode and said top electrode, wherein said middle electrode comprises an extension portion that is coplanar with said top electrode;

a lower dielectric layer positioned between said bottom electrode and said middle electrode;

an upper dielectric layer positioned between said middle electrode and said top electrode;

an isolation region of dielectric material formed above a first portion of said upper dielectric layer positioned above a horizontal portion of said extension portion and laterally disposed between a second portion of said upper dielectric layer positioned adjacent a vertical portion of said extension portion and said top electrode, said isolation region and said upper dielectric layer providing a first separation between said middle electrode and said top electrode adjacent said vertical portion having a first width greater than a second width of a second separation between said middle electrode and said top electrode adjacent said horizontal portion;

a first contact conductively coupled to said top electrode; and a second contact conductively coupled to said middle electrode.

11. The capacitor of claim 10, wherein said middle electrode is formed in a recess having a sidewall, and said extension portion is positioned at least partially on said sidewall of said recess.

12. The capacitor of claim 10, further comprising a conductive via coupling said top electrode to said bottom electrode.

13. The capacitor of claim 10, further comprising a barrier layer positioned between said bottom electrode and said lower dielectric layer.

14. The capacitor of claim 10, further comprising a first dielectric layer formed above said top electrode, wherein said first and second contacts are embedded in said first dielectric layer.

15. The capacitor of claim 10, wherein said middle electrode comprises at least one of TiN, Ti, TaN, or Ta.

16. The capacitor of claim 15, wherein said top electrode comprises copper.

17. The capacitor of claim 11, wherein said recess has a sloped sidewall.

* * * * *